(12) United States Patent
Hirano

(10) Patent No.: US 6,657,312 B2
(45) Date of Patent: Dec. 2, 2003

(54) SEMICONDUCTOR DEVICE IN WHICH BUMP USED FOR FIXING POTENTIAL OF SILICON SUBSTRATE CAN BE EASILY FORMED

(75) Inventor: Yuuichi Hirano, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/028,317

(22) Filed: Dec. 28, 2001

(65) Prior Publication Data
US 2002/0130414 A1 Sep. 19, 2002

(30) Foreign Application Priority Data
Mar. 14, 2001 (JP) ......................... 2001-071942

(51) Int. Cl.[7] .................. H01L 23/48; H01L 23/52; H01L 29/40
(52) U.S. Cl. .................. 257/780; 257/347; 257/737; 257/738; 257/778
(58) Field of Search ................. 257/347–354, 257/737–738, 778, 780

(56) References Cited

U.S. PATENT DOCUMENTS

| | | | | |
|---|---|---|---|---|
| 5,219,117 A | * | 6/1993 | Lin | 228/253 |
| 5,880,017 A | * | 3/1999 | Schwiebert et al. | 438/613 |
| 5,926,735 A | * | 7/1999 | Yamazaki et al. | 438/635 |
| 6,084,284 A | * | 7/2000 | Adamic, Jr. | 257/506 |
| 6,165,885 A | * | 12/2000 | Gaynes et al. | 438/612 |
| 6,271,111 B1 | * | 8/2001 | Farooq et al. | 438/614 |
| 6,403,459 B1 | * | 6/2002 | Ohashi et al. | 438/618 |
| 6,558,979 B2 | * | 5/2003 | Farnworth et al. | 438/108 |
| 2001/0008311 A1 | * | 7/2001 | Harada et al. | 257/758 |
| 2002/0020862 A1 | * | 2/2002 | Livengood et al. | 257/276 |
| 2002/0110954 A1 | * | 8/2002 | Maeda et al. | 438/106 |
| 2002/0192936 A1 | * | 12/2002 | Ball | 438/613 |

FOREIGN PATENT DOCUMENTS

JP 6-244239 9/1994

OTHER PUBLICATIONS

S. Campbell, GaAs FET Technologies, p. 456, "The Science and Engineering of Mictroelectronic Fabrication", 1996.

N.G. Tarr, et al. "A Simple Implanted Backgate MOSFET for Dynamic Threshold Control in Fully–Depleted SOI CMOS" Proceedings 1996 IEEE International SOI Conference, Oct. 1996. pp. 76–77.

* cited by examiner

Primary Examiner—Amir Zarabian
Assistant Examiner—Ida M. Soward
(74) Attorney, Agent, or Firm—Oblon, Spivak, McClelland, Maier & Neustadt, P.C.

(57) ABSTRACT

A semiconductor flip chip device having an SOI substrate in which a bump for fixing a potential of a silicon substrate is simply formed a layer (2), including a BOX layer and a silicon layer of the SOI substrate is formed. A semiconductor element selectively is formed on the silicon layer and an interlayer insulation film is then formed on the semiconductor element and the silicon layer. Selectively formed in a silicon nitride film (4) and the layer (2) is a hollow (41) extending from an upper surface of the silicon nitride film (4) to reach an upper surface of the silicon substrate (1). The hollow (41) is formed in an area where the semiconductor element is not formed. The hollow has its side surface defined by the silicon nitride film (4) and the layer (2) and its bottom surface defined by the upper surface of the silicon substrate (1). A bump (5d) made of solder is formed on a part of the upper surface of the silicon substrate (1) defining the bottom surface of the hollow (41). The bump (5d) is provided for fixing the potential of the silicon substrate (1).

6 Claims, 32 Drawing Sheets

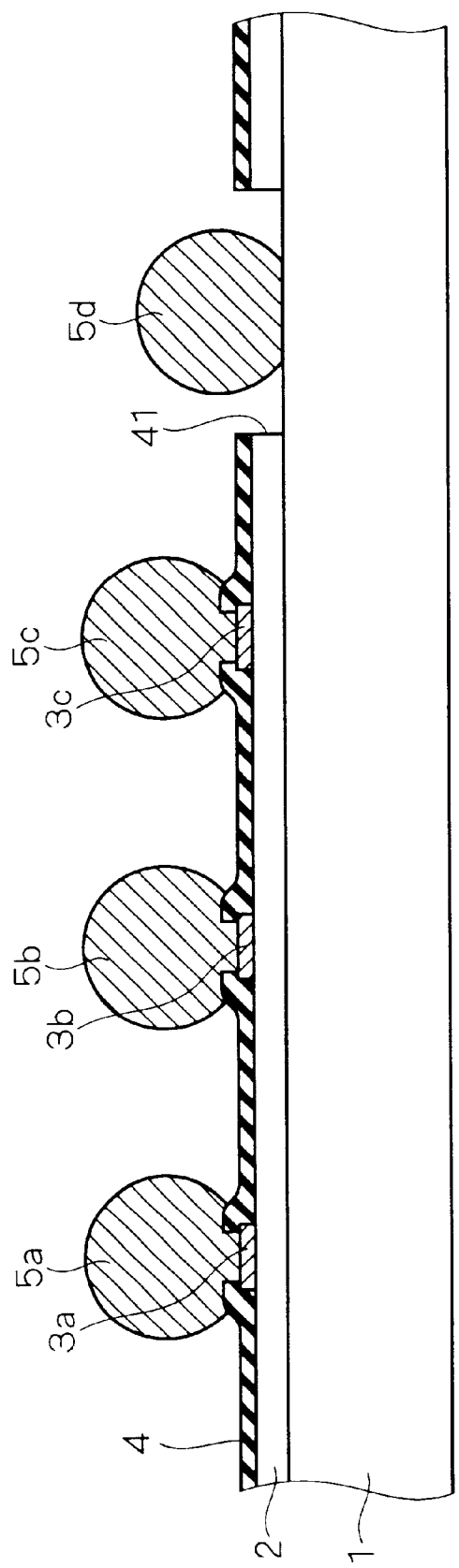

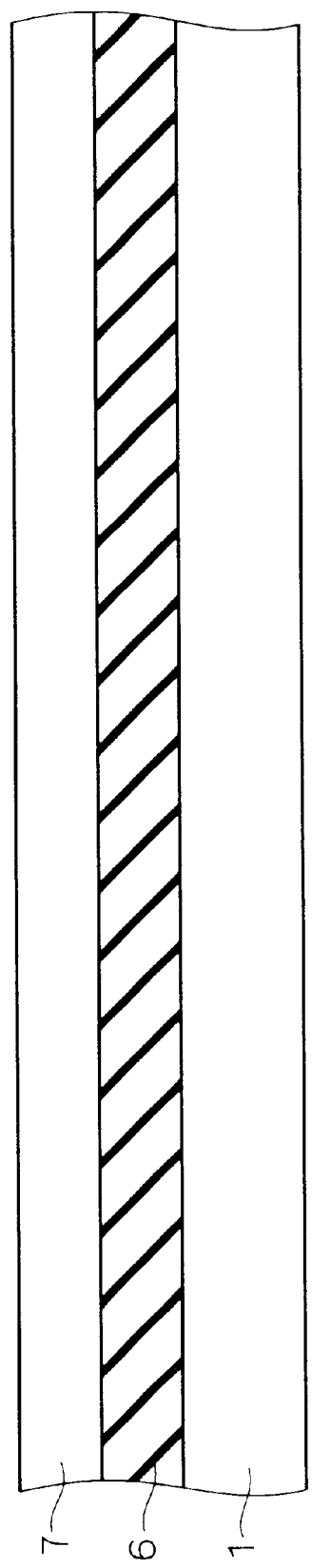

SEMICONDUCTOR DEVICE IN WHICH BUMP USED FOR FIXING POTENTIAL OF SILICON SUBSTRATE CAN BE EASILY FORMED

BACKGROUND OF THE INVENTION

1. Field of the Invention

The present invention relates to a semiconductor device and a method of manufacturing the same, and more particularly to a structure of a flip chip using an SOI (Silicon On Insulator) substrate and a method of manufacturing the same.

2. Description of the Background Art

FIGS. 25 through 28 are schematic views for explaining a soldering method using a flip chip. FIGS. 25 and 26 are top views and FIGS. 27 and 28 are sectional views. Referring to FIG. 25, a plurality of electrode pads 103 made of aluminum are formed on an upper surface of a flip chip 100 already undergone dicing. A silicon nitride film 104 is formed on a part of the upper surface of the flip chip 100 where the electrode pads 103 are not formed. Referring to FIG. 26, a bump 105 is formed on the electrode pads 103 of the flip chip 100. Referring to FIG. 27, the flip chip 100 on which the bump 105 is formed is turned upside-down, and thereafter, is mounted on a pattern formed on a wiring substrate 170 by soldering. Further, as shown in FIG. 28, there is a case where the flip chip 100 is mounted on the wiring substrate 170, and thereafter, is sealed with resin 171.

FIG. 29 is a sectional view showing a structure of a conventional flip chip using an SOI substrate. A layer 102 is formed on a silicon substrate 101. The layer 102 includes a BOX (Burried Oxide) layer and a silicon layer of the SOI substrate, a semiconductor element selectively formed on the silicon layer and an interlayer insulation film formed on the semiconductor element and the silicon layer. A plurality of electrode pads 103a to 103d are formed on the layer 102. The electrode pads 103a to 103c are electrically connected to the semiconductor element through a tungsten plug filling a contact hole formed in the interlayer insulation film and a wiring made of aluminum. The electrode pad 103d is electrically connected to the silicon substrate 101 through a conductive plug 173 made of polysilicon, tungsten or the like, which fills a contact hole 172 extending from an upper surface of the layer 102 to reach an upper surface of the silicon substrate 101. Further formed on the layer 102 is a silicon nitride film 104 patterned so as to expose the electrode pads 103a to 103d. Formed on the electrode pads 103a to 103d are bumps 105a to 105d made of solder, respectively. The bump 105d is provided for fixing a potential of the silicon substrate 101.

FIGS. 30 through 34 are sectional views showing manufacturing steps of the conventional flip chip shown in FIG. 29 in sequential order. Referring to FIG. 30, an SOI wafer is prepared first, and after carrying out usual processes of manufacturing a semiconductor, a structure is obtained in which the layer 102 is formed on the silicon substrate 101. Next, referring to FIG. 31, a photoresist 174 having a predetermined opening pattern is formed on the layer 102 by photolithography. Next, the layer 102 is subjected to anisotropic dry etching using the photoresist 174 as an etching mask so as to expose a part of the upper surface of the silicon substrate 101. Thereby formed is the contact hole 172 having its side surface defined by the layer 102 and its bottom surface defined by the upper surface of the silicon substrate 101. Such a step requires anisotropic dry etching with a very high aspect ratio.

Next, referring to FIG. 32, after removing the photoresist 174, a conductive film 175 made of a polysilicon film, a tungsten film or the like is formed on an entire surface by CVD method in a thickness that can fill the contact hole 172. Next, Referring to FIG. 33, the polysilicon film 175 is removed by CMP method until an upper surface of the layer 102 is exposed. Thereby, the contact hole 172 is filled with the polysilicon 173. Next, referring to FIG. 34, after forming an aluminum film on the layer 102, the aluminum film is patterned, thereby forming the electrode pads 103a to 103d at predetermined positions on the layer 102. The electrode pad 103d is in contact with the polysilicon 173.

Subsequently, after forming a silicon nitride film on the entire surface, the silicon nitride film is patterned, thereby forming the silicon nitride film 104. Next, after dicing the SOI wafer, the bumps 105a to 105d are formed on the electrode pads 103a to 103d, respectively, thereby obtaining the structure shown in FIG. 29.

In such a conventional flip chip, however, the electrode pad 103d is electrically connected to the silicon substrate 101 through the polysilicon 173 which fills the contact hole 172 formed in the layer 102. Accordingly, this requires the steps of: forming the contact hole 172 in the layer 102 by anisotropic dry etching with a very high aspect ratio (FIG. 31); forming the polysilicon film 175 on the entire surface (FIG. 32); and etching back the polysilicon film 175 by CMP method (FIG. 33), resulting in difficulties in the manufacturing steps.

SUMMARY OF THE INVENTION

A first aspect of the present invention is directed to a semiconductor device. The semiconductor device comprises: an SOI substrate including a semiconductor substrate, an insulation layer formed on a main surface of the semiconductor substrate and a semiconductor layer formed on the insulation layer; a semiconductor element selectively formed on the semiconductor layer; an interlayer insulation film formed on the semiconductor element and the semiconductor layer; a first electrode pad formed on a main surface of the interlayer insulation film, being electrically connected to the semiconductor element; a first bump formed on the first electrode pad; a hollow selectively formed extending from the main surface of the interlayer insulation film to reach the main surface of the semiconductor substrate; and a second bump formed on the semiconductor substrate which defines a bottom surface of the hollow.

According to a second aspect of the present invention, the semiconductor device of the first aspect further comprises a second electrode pad formed on the main surface of the semiconductor substrate which defines the bottom surface of the hollow, wherein the second bump is formed on the second electrode pad.

According to a third aspect of the present invention, the semiconductor device of the second aspect further comprises an impurity region formed in the main surface of the semiconductor substrate which defines the bottom surface of the hollow.

A fourth aspect of the present invention is directed to a method of manufacturing a semiconductor device. The method comprises the steps of: (a) preparing an SOI substrate including a semiconductor substrate, an insulation layer formed on a main surface of the semiconductor substrate and a semiconductor layer formed on the insulation layer; (b) selectively forming a semiconductor element on the semiconductor layer; (c) forming an interlayer insulation film on the semiconductor element and the semiconductor layer; (d) forming a first electrode pad on a main surface of the interlayer insulation film, the first electrode pad being electrically connected to the semiconductor element; (e) selectively forming a hollow which extends from the main surface of the interlayer insulation film to reach the main surface of the semiconductor substrate; and (f) forming a first bump on the first electrode pad and a second bump on the semiconductor substrate which defines a bottom surface of the hollow, respectively.

According to a fifth aspect of the present invention, the method of the fourth aspect further comprises the step of (g) forming a second electrode pad on the main surface of the semiconductor substrate which defines the bottom surface of the hollow, the step (g) being executed after the step (e) and before the step (f), wherein the second bump is formed on the second electrode pad in the step (f).

According to a sixth aspect of the present invention, in the method of the fifth aspect, the steps (d) and (g) are executed by the same process.

According to a seventh aspect of the present invention, the method of the fifth or sixth aspect further comprises the step of (h) forming an impurity region in the main surface of the semiconductor substrate which defines the bottom surface of the hollow, the step (h) being executed after the step (e) and before the step (g).

In the semiconductor device according to the first aspect of the present invention, the second bump for fixing a potential of the semiconductor substrate is formed on a part of the semiconductor substrate defining the bottom surface of the hollow. This allows simplification of manufacturing compared to a type of semiconductor device in which the second bump and the semiconductor substrate are brought into electric contact with each other through polysilicon which fills a contact hole reaching the semiconductor substrate.

In the semiconductor device according to the second aspect of the present invention, the second bump is formed on the second electrode pad, resulting in improved adhesion of the second bump compared to the case of forming the second bump directly on the semiconductor substrate.

In the semiconductor device according to the third aspect of the present invention, it is possible to reduce a resistance value of the semiconductor substrate at a position being in contact with the second electrode pad.

With the method according to the fourth aspect of the present invention, the second bump for fixing a potential of the semiconductor substrate is formed on a part of the semiconductor substrate defining the bottom surface of the hollow in the step (f). This allows manufacturing to be simplified compared to a method of manufacturing a semiconductor device comprising the steps of: forming a contact hole reaching the semiconductor substrate; forming a polysilicon film on the entire surface so as to fill the contact hole; etching back the polysilicon film; and forming the second bump on the polysilicon film filling the contact hole.

With the method according to the fifth aspect of the present invention, the second bump is formed on the second electrode pad, which results in improved adhesion of the second bump compared to the case of forming the second bump directly on the semiconductor substrate.

With the method according to the sixth aspect of the present invention, the second electrode pad can be formed on the main surface of the semiconductor substrate in the step (g) without adding a specific step of forming the same.

With the method according to the seventh aspect of the present invention, it is possible to reduce a resistance value of the semiconductor substrate at a position being in contact with the second electrode pad.

An object of the present invention is to provide a semiconductor device and a method of manufacturing the same, in which a bump for fixing a potential of a silicon substrate can be formed by simplified steps.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view showing a structure of a flip chip according to a first preferred embodiment of the present invention;

FIGS. 25 through 28 are schematic views for explaining a soldering method using a flip chip;

DESCRIPTION OF THE PREFERRED EMBODIMENTS

First Preferred Embodiment

Figure 3:
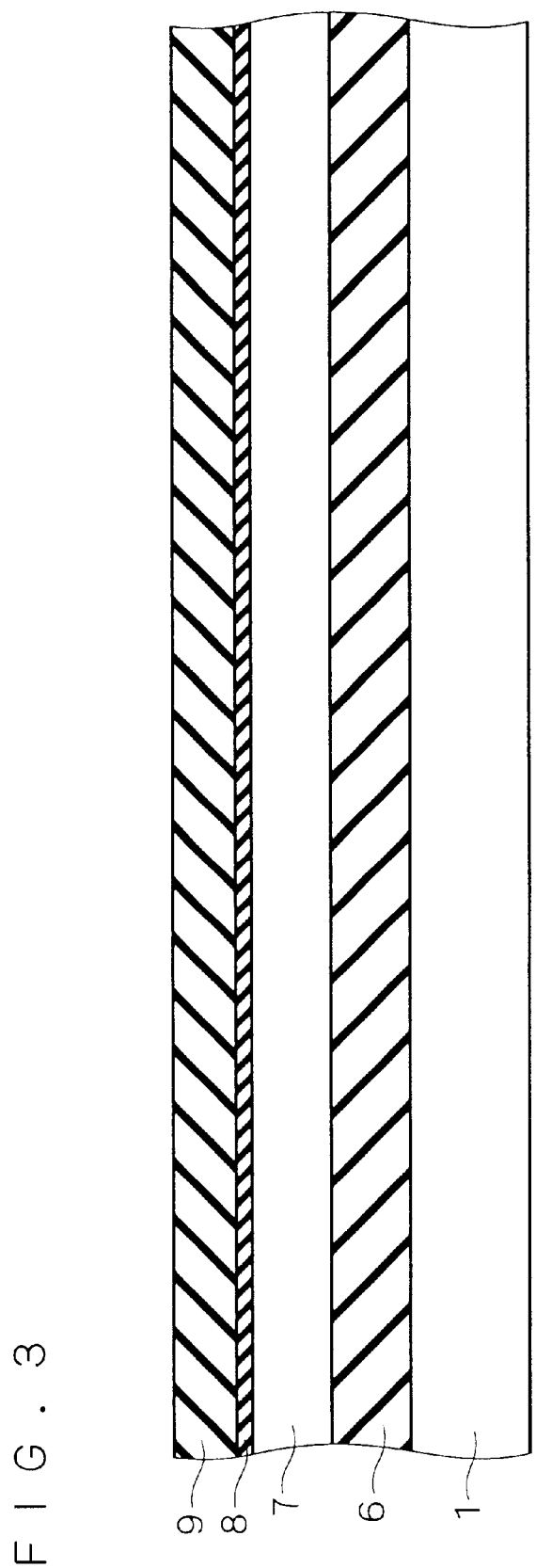
FIGS. 2 through 13 are sectional views showing steps in sequential order until a silicon nitride film is formed.

FIG. 1 is a sectional view showing a structure of a flip chip using an SOI substrate according to a first embodiment. A layer 2 is formed on an upper surface of a silicon substrate 1. The layer 2 includes a BOX layer and a silicon layer of the SOI substrate, a semiconductor element selectively formed on the silicon layer and an interlayer insulation film formed on the semiconductor element and the silicon layer. A plurality of electrode pads 3a to 3c made of aluminum are formed on an upper surface of the layer 2. The electrode pads 3a to 3c are electrically connected to the semiconductor element through a tungsten plug filling a contact hole formed in the interlayer insulation film and a wiring made of aluminum. Further formed on the upper surface of the layer 2 is a silicon nitride film 4 patterned so as to expose the electrode pads 3a to 3c. Bumps 5a to 5c made of solder are formed on the electrode pads 3a to 3c, respectively.

Selectively formed in the silicon nitride film 4 and the layer 2 is a hollow 41 extending from an upper surface of the silicon nitride film 4 to reach the upper surface of the silicon substrate 1. The hollow 41 is formed in an area where the semiconductor element is not formed, and has its side surface defined by the silicon nitride film 4 and the layer 2 and its bottom surface defined by the upper surface of the silicon substrate 1. A bump 5d made of solder is formed directly on a part of the upper surface of the silicon substrate 1 defining the bottom surface of the hollow 41. The bump 5d is provided for fixing a potential of the silicon substrate 1.

FIG. 1 is illustrated as if the bump 5d is formed in a position lower than the bumps 5a to 5c and there is a difference in steps. However, the bumps 5a to 5d have a diameter ranging from 100 to 1000 $\mu$m, whereas the sum of thicknesses of the layer 2 and the silicon nitride film 4 is the order of several $\mu$m (e.g., 3 $\mu$m). Therefore, the thicknesses of the layer 2 and the silicon nitride film 4 are so thin that are negligible compared to the diameter of the bumps 5a to 5d. This is actually tantamount to that the bumps 5a to 5d are formed with no difference in steps.

Figure 2:
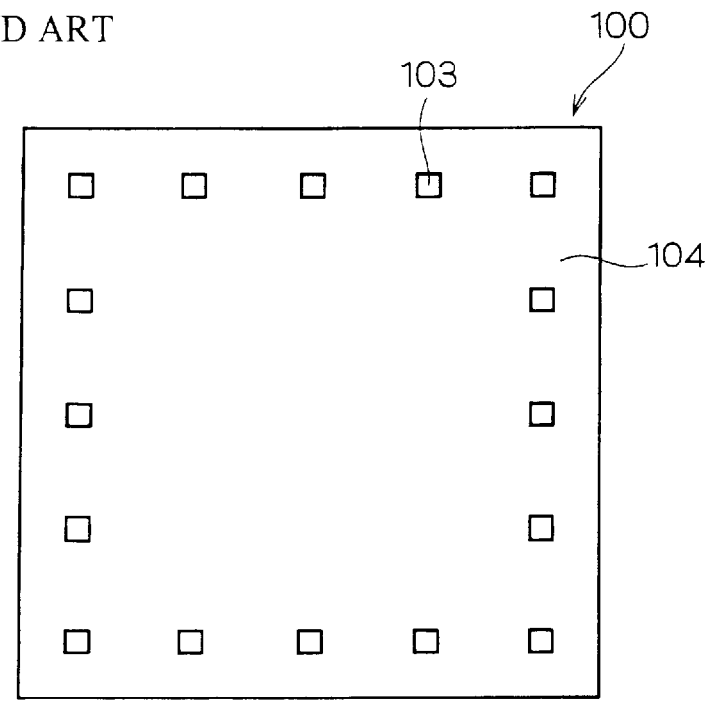
Figure 2:
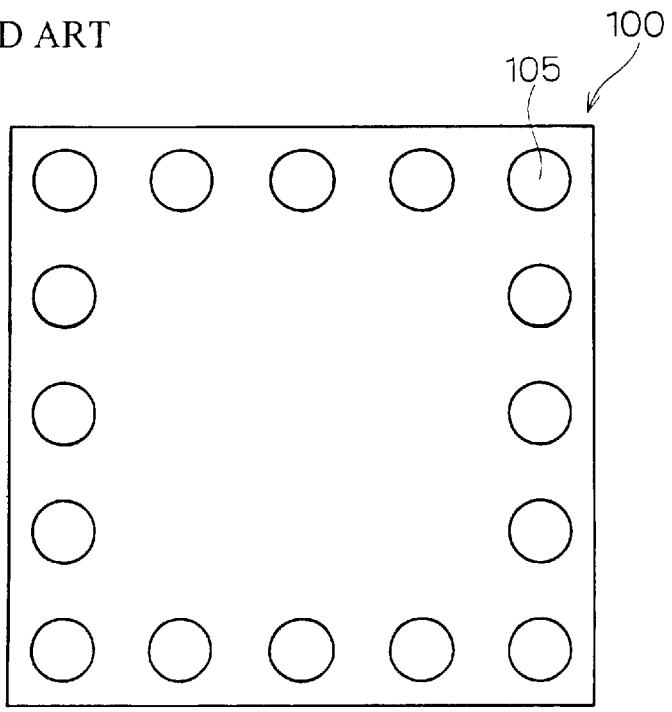
Figure 27:
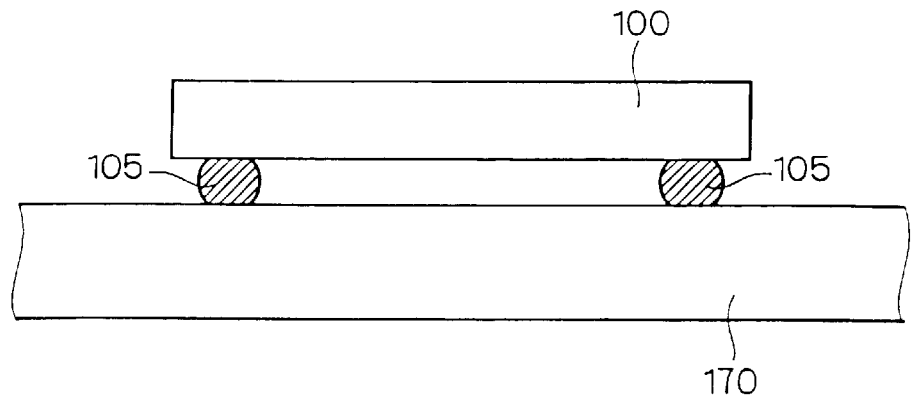
Figure 28:
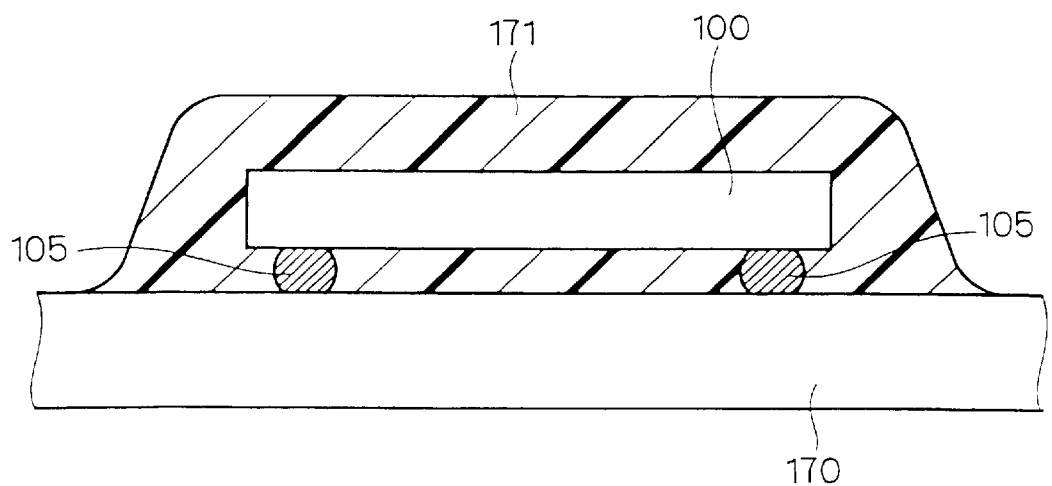
Figure 29:
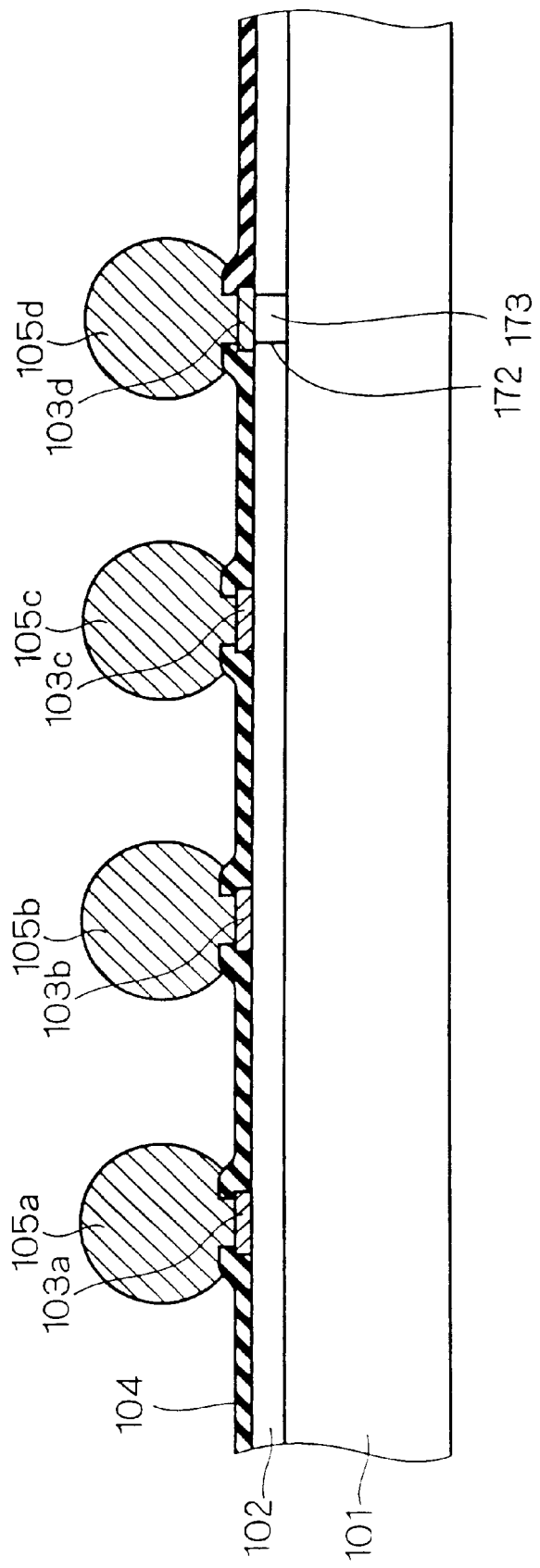
FIG. 29 is a sectional view showing a structure of a conventional flip chip.
Figure 30:
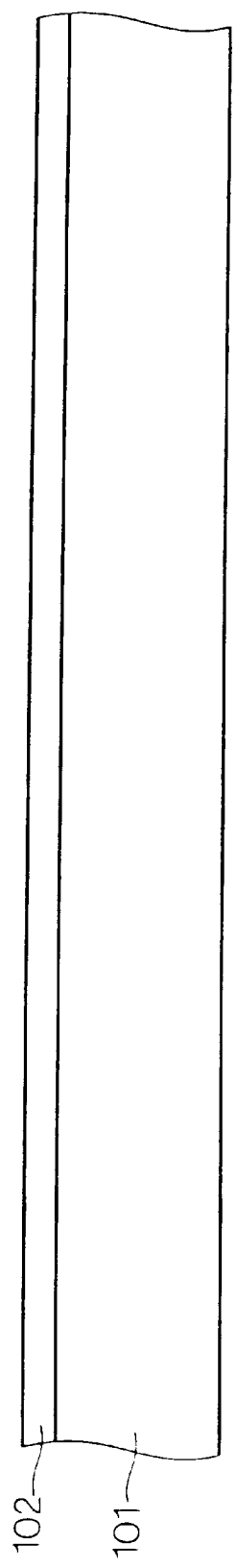
FIGS. 30 through 34 are sectional views showing a manufacturing method of the conventional flip chip in sequential order.

FIGS. 2 through 13 are sectional views showing steps in sequential order until the silicon nitride film 4 is formed. Referring to FIG. 2, prepared first is an SOI wafer having a structure in which the silicon substrate 1, a BOX layer 6 of about 400 nm thickness and a silicon layer 7 of about 200 nm thickness are formed in this order. Next, referring to FIG. 3, a silicon oxide film 8 of about 20 nm thickness and a silicon nitride film 9 of about 200 nm thickness are formed in this order entirely on an upper surface of the silicon layer 7 by thermal oxidation and CVD method.

Figure 4:
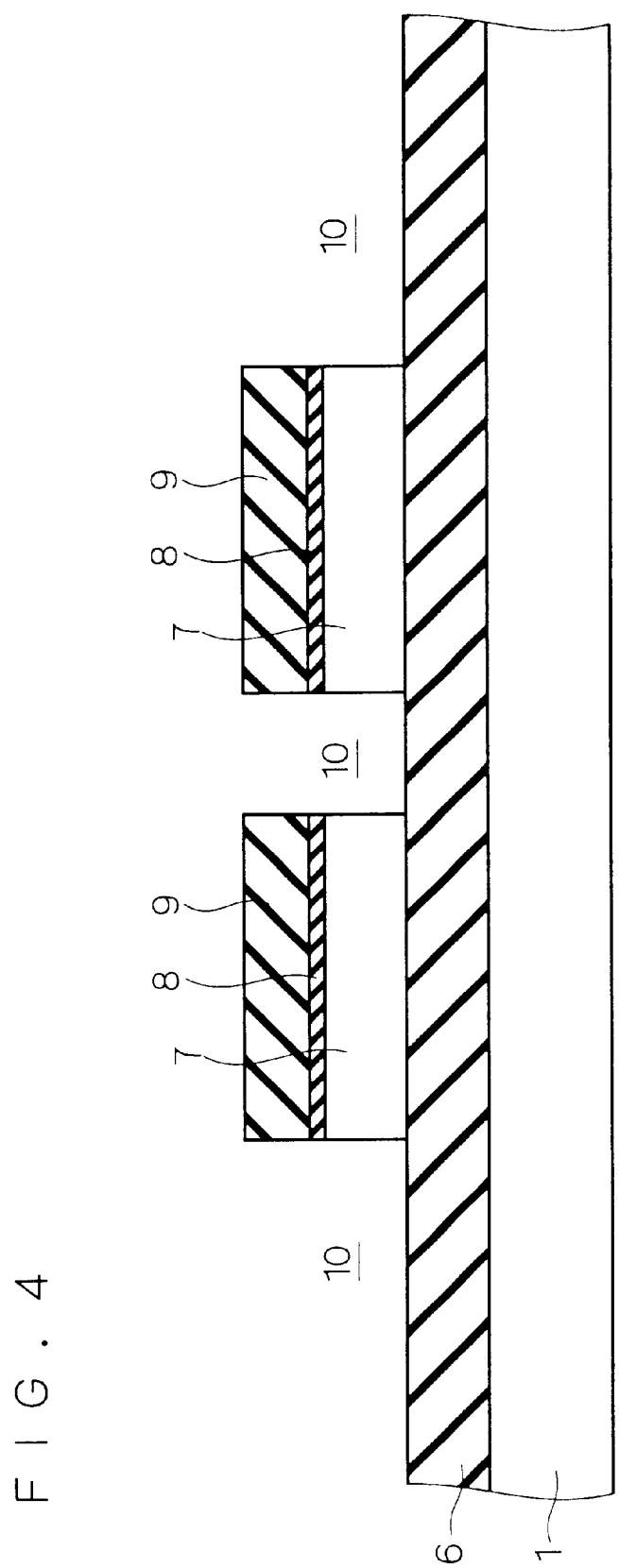
Figure 5:
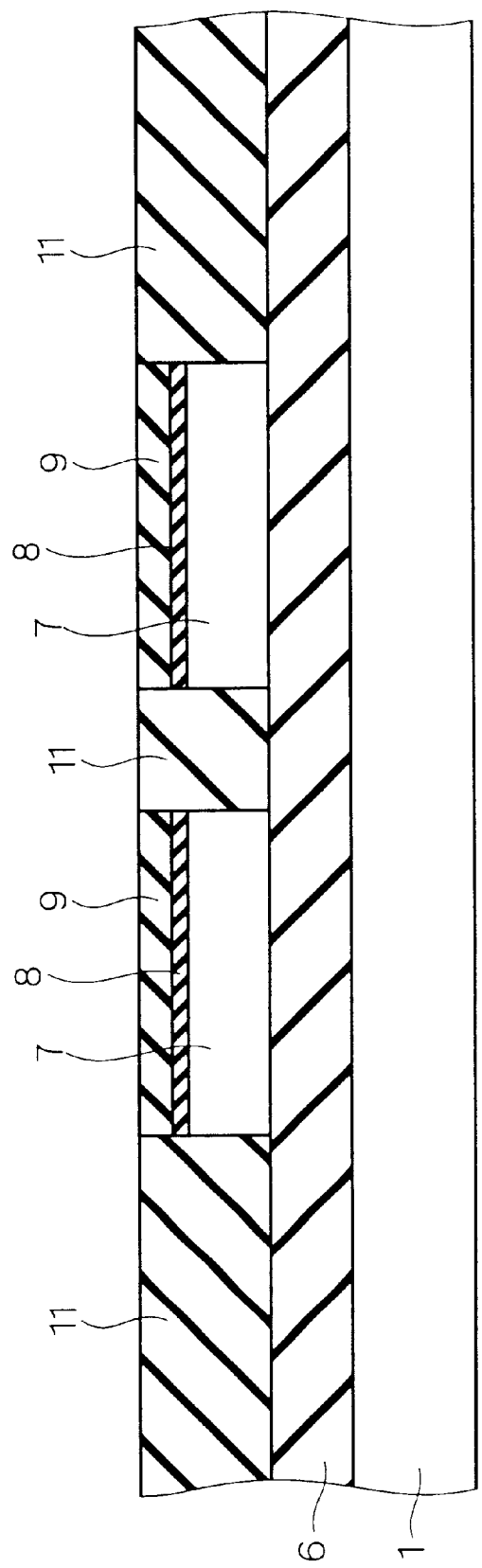

Next, referring to FIG. 4, the silicon nitride film 9 and the silicon oxide film 8 are patterned in a predetermined form by photolithography and anisotropic dry etching. Next, using the remaining part of the silicon nitride film 9 as an etching mask, the silicon layer 7 is subjected to anisotropic dry etching until the BOX layer 6 is exposed. Thereby formed is a hollow 10 having its bottom surface defined by the BOX layer 6 and its side surface defined by the silicon layer 7. Next, referring to FIG. 5, a silicon oxide film 11 of about 500 nm thickness is formed on the entire surface by CVD method using plasma of high density. Subsequently, the silicon oxide film 11 is etched back by CMP (Chemical Mechanical Polishing) method. The CMP processing stops with the bottom of the silicon nitride film 9 remained.

Figure 6:
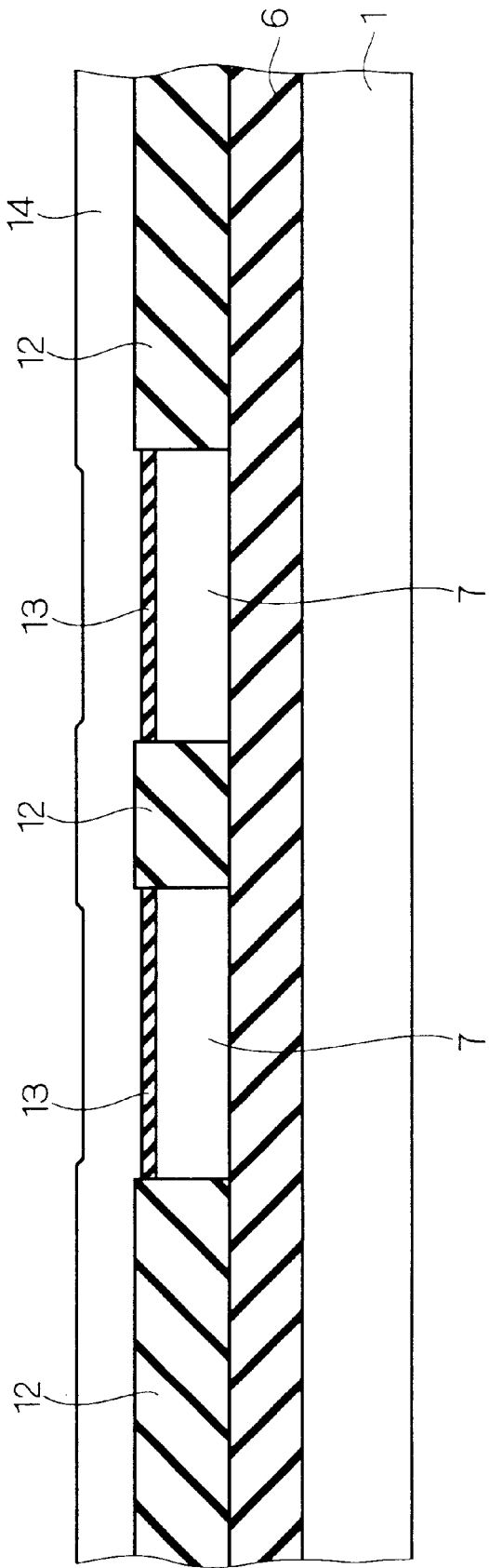

Next, referring to FIG. 6, the remaining part of the silicon nitride film 9 is removed by wet etching. Then, in order to form a channel region, an impurity such as boron (in the case of forming NMOS) is implanted into the silicon layer 7 through the silicon oxide film 8 by ion implantation method under the condition of several tens of keV and several e12 $cm^{-2}$. In the case of forming PMOS, an impurity such as arsenic may be ion implanted under the condition of several hundreds of keV and several e12 $cm^{-2}$. Next, the silicon oxide film 8 is removed by wet etching. At this time, an upper portion of the silicon oxide film 11 is also removed to some extent by the wet etching. Accordingly, an element isolating insulation film 12 is obtained from the remaining part of the silicon oxide film 11. Next, after forming a silicon oxide film 13 of about 5 nm thickness by thermal oxidation, a polysilicon film 14 of about 200 nm thickness is formed on the entire surface by CVD method.

Figure 7:
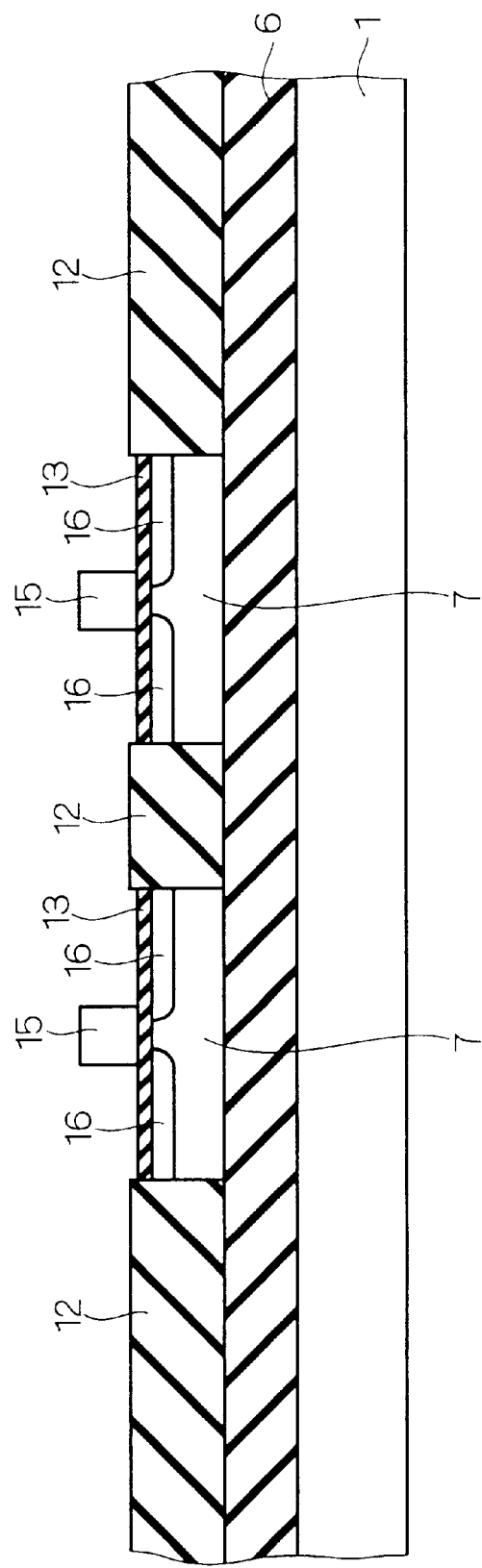

Next, referring to FIG. 7, the polysilicon film 14 is patterned by photolithography and anisotropic dry etching, thereby forming a polysilicon film 15. Next, using the polysilicon film 15 and the element isolating insulation film 12 as implantation masks, an impurity such as arsenic (in the case of forming NMOS) is implanted into the silicon layer 7 under the condition of several tens of keV and several e14 $cm^{-2}$. Accordingly, a low-concentration region 16 of relatively low concentration is formed shallowly in the upper surface of the silicon layer 7. In the case of forming PMOS, an impurity such as boron fluoride may be ion implanted under the condition of several tens of keV and several e14 $cm^{-2}$.

Figure 8:
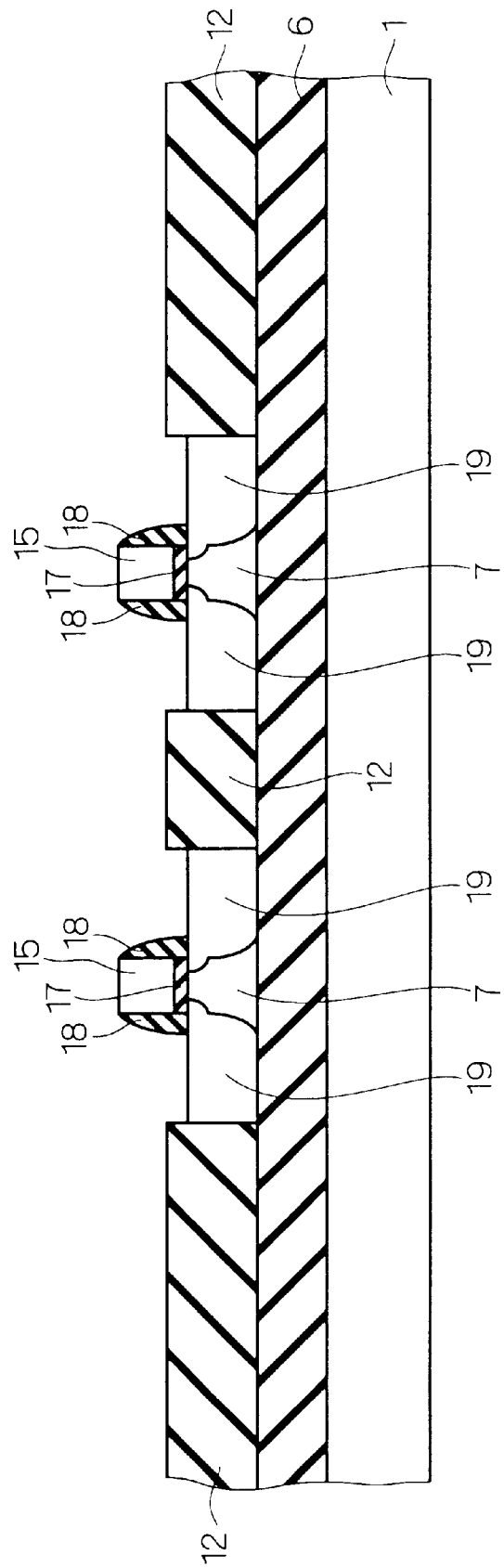

Next, referring to FIG. 8, after forming a silicon oxide film having a thickness of about several tens of nm on the entire surface by CVD method, the silicon oxide film and the silicon oxide film 13 are subjected to anisotropic dry etching, thereby forming a sidewall 18 on a side surface of the polysilicon film 15. A part of the silicon oxide film 13 serving as an underlying layer of the sidewall 18 is considered as part of the sidewall 18 and shown integrally with the sidewall 18. Another part of the silicon oxide film 13 serving as an underlying layer of the polysilicon film 15 corresponds to the gate oxide film 17. Next, an impurity such as arsenic (in the case of forming NMOS) is implanted into the silicon layer 7 through the silicon oxide film 13 by ion implantation method under the condition of several tens of keV and several e15 $cm^{-2}$. Thereby formed is a source/drain region 19 of relatively high concentration including the low-concentration region 16 below the polysilicon film 15. The source/drain region 19 extends from the upper surface of the silicon layer 7 to reach an upper surface of the BOX layer 6. In the case of forming PMOS, an impurity such as boron fluoride may be ion implanted under the condition of several tens of keV and several e15 $cm^{-2}$.

Figure 9:
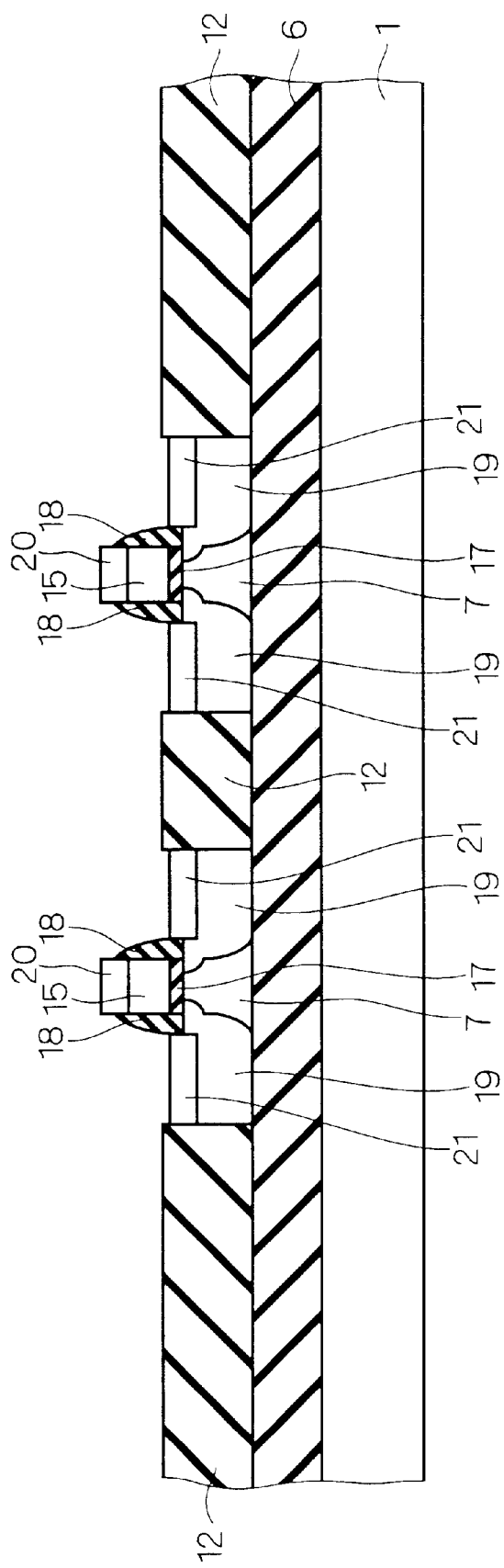

Next, referring to FIG. 9, after forming a cobalt film in a thickness of about several nm on the entire surface, heat treatment is performed at a temperature of several hundred degrees for about 1 minutes. Accordingly, silicon and cobalt being in contact with each other react to cause silicidation reaction. As a result, an upper surface of the source/drain region 19 is silicided to be a cobalt silicide layer 21 while an upper surface of the polysilicon film 15 is silicided to be a cobalt silicide layer 20. Thereafter, a part of the cobalt film which has not reacted with silicon is removed by wet etching.

Figure 10:
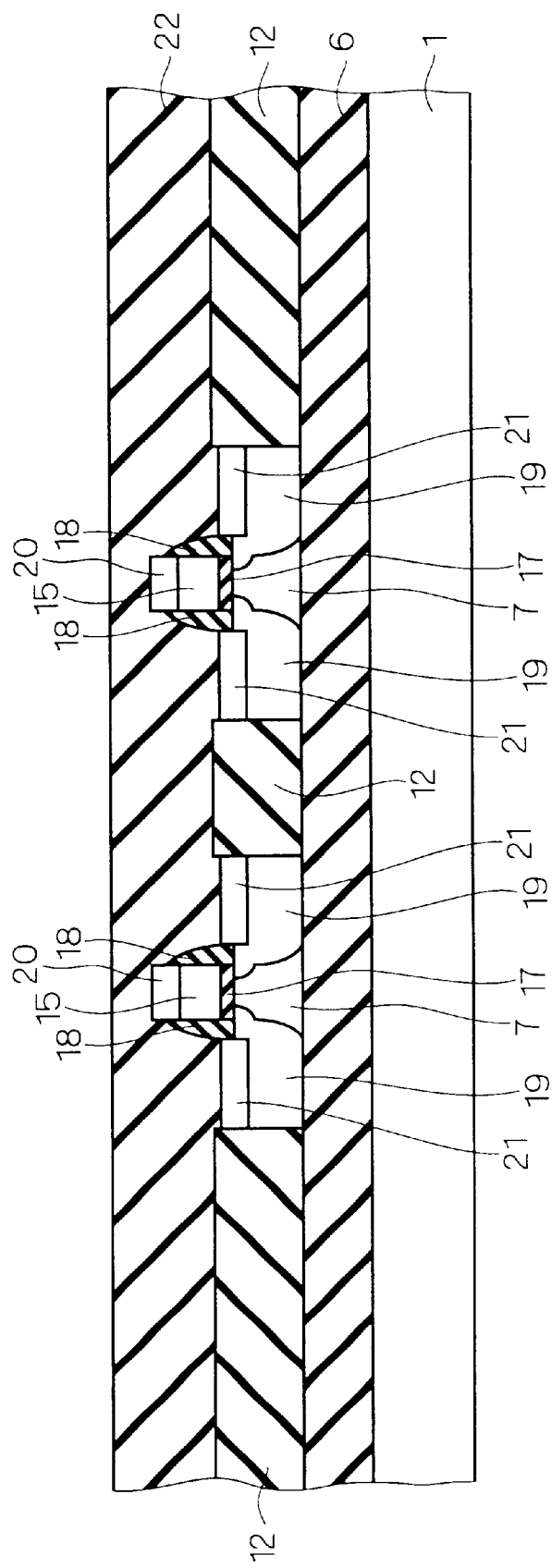

Next, referring to FIG. 10, after forming a silicon oxide film in a thickness of about 1 $\mu$m on the entire surface by CVD method, a film thickness of about several hundreds of nm is removed from an upper surface of the silicon oxide film by CMP method, thereby forming a silicon oxide film 22 having a planarized upper surface. Next, referring to FIG. 11, a contact hole 23 extending from an upper surface of the silicon oxide film 22 to reach an upper surface of the silicide layer 21 is formed selectively in the silicon oxide film 22 by photolithography and anisotropic dry etching. Next, after forming a tungsten film of about 500 nm thickness on the entire surface by CVD method, the tungsten film is removed by CMP method until the upper surface of the silicon oxide film 22 is exposed, thereby forming a tungsten plug 24 which fills the contact hole 23. Next, an aluminum wiring 25 in contact with the tungsten plug 24 is formed on the upper surface of the silicon oxide film 22.

Figure 11:
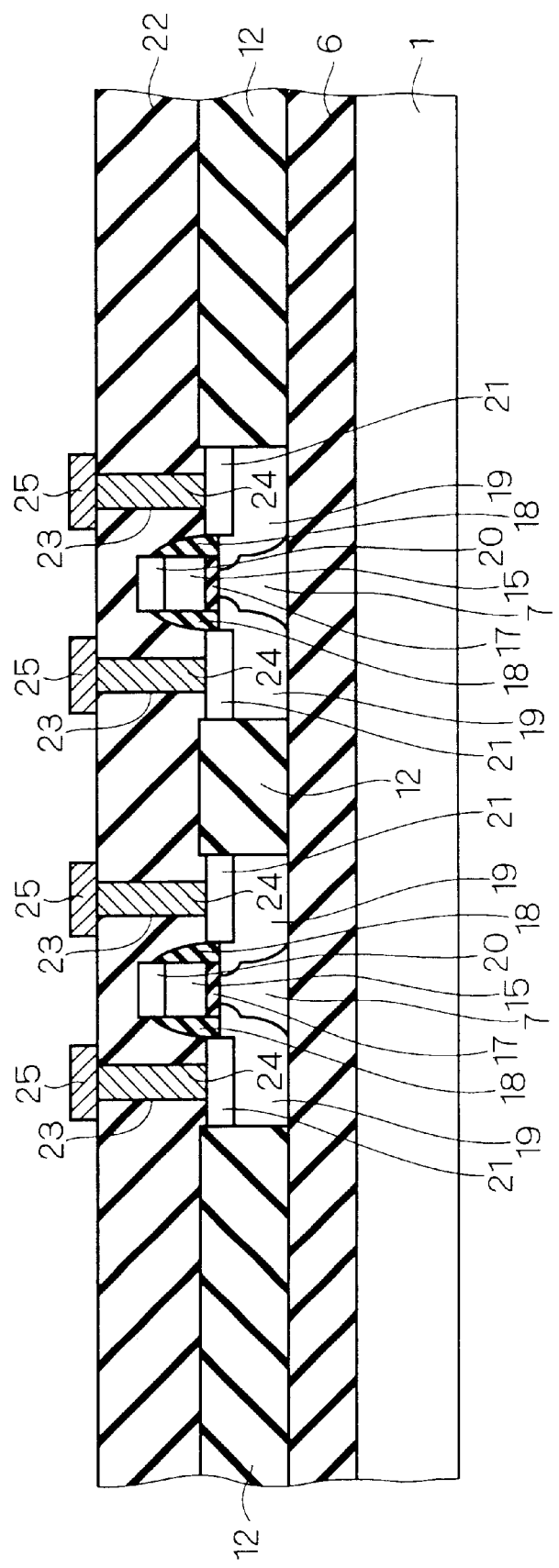
Figure 12:
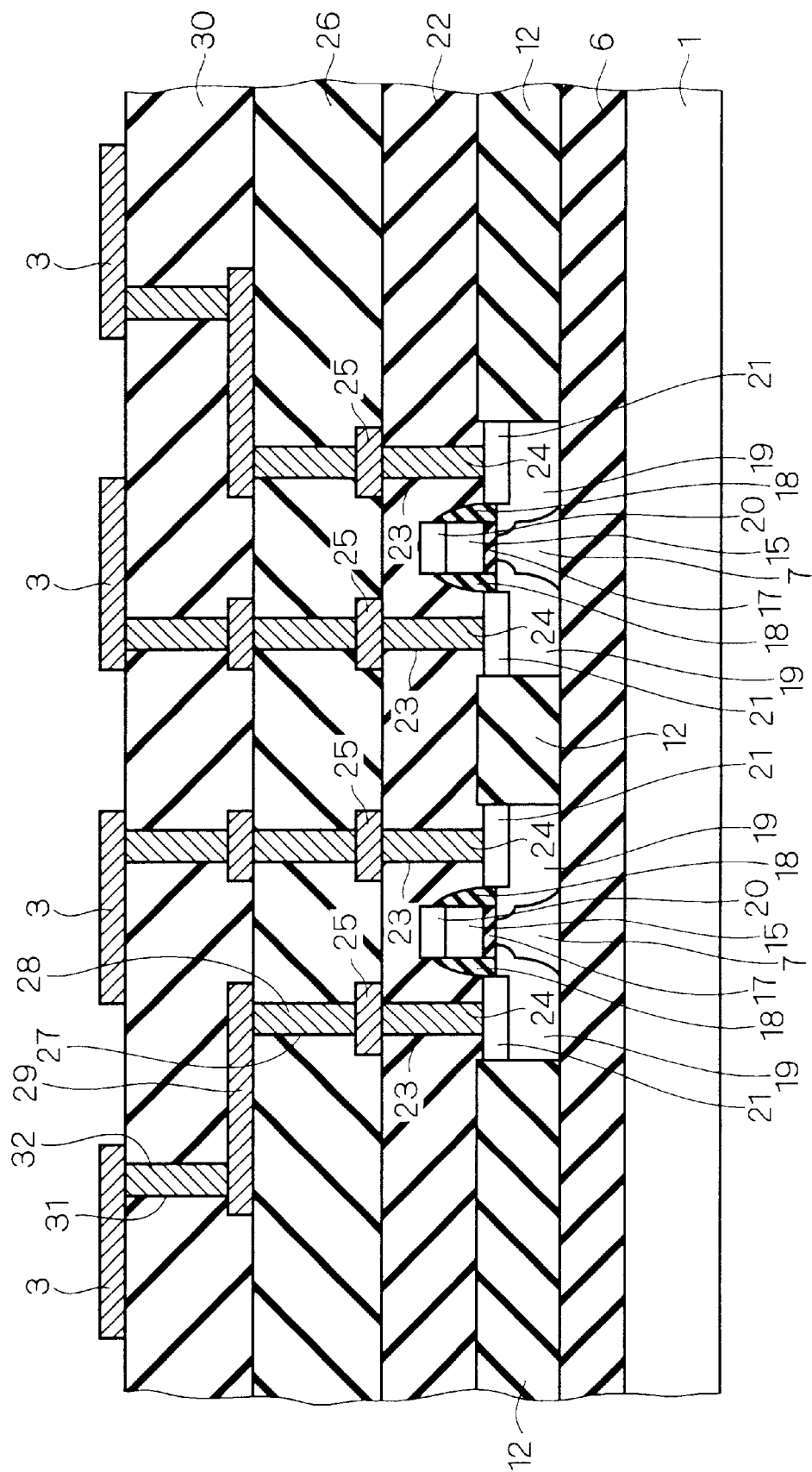
Figure 13:
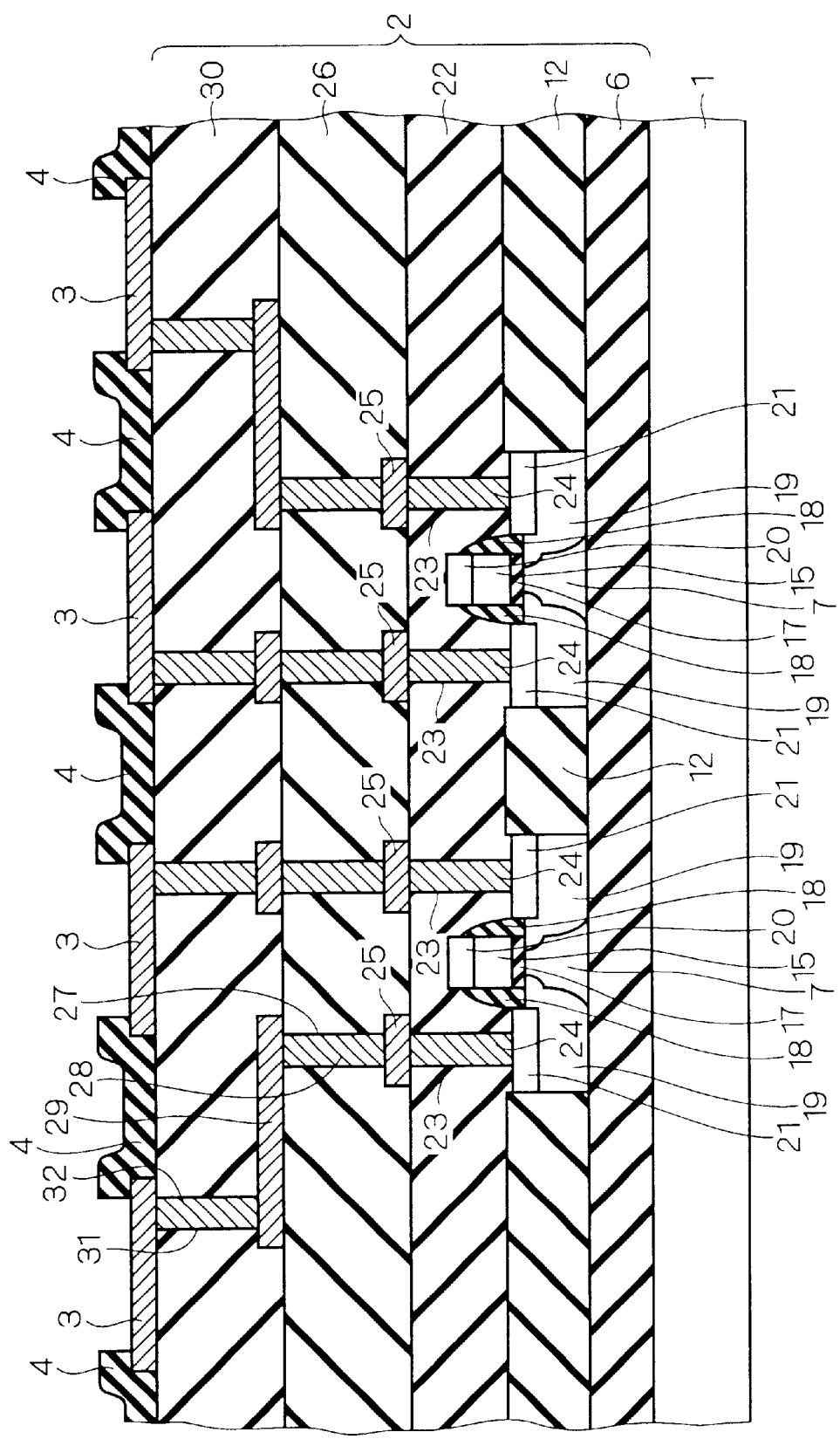

Next, referring to FIG. 12, the steps shown in FIGS. 10 and 11 are repeated to form silicon oxide film 26 and 30, contact holes 27 and 31, aluminum wiring 29, and tungsten plugs 28 and 32. Formed on an upper surface of the silicon oxide film 30 disposed uppermost is an electrode pad 3 made of aluminum (corresponding to the electrode pads 3a to 3c shown in FIG. 1) which is in contact with the tungsten plug 32. Next, referring to FIG. 13, a silicon nitride film is formed on the silicon oxide film 30, and the silicon nitride film is patterned to obtain the silicon nitride film 4.

Figure 14:
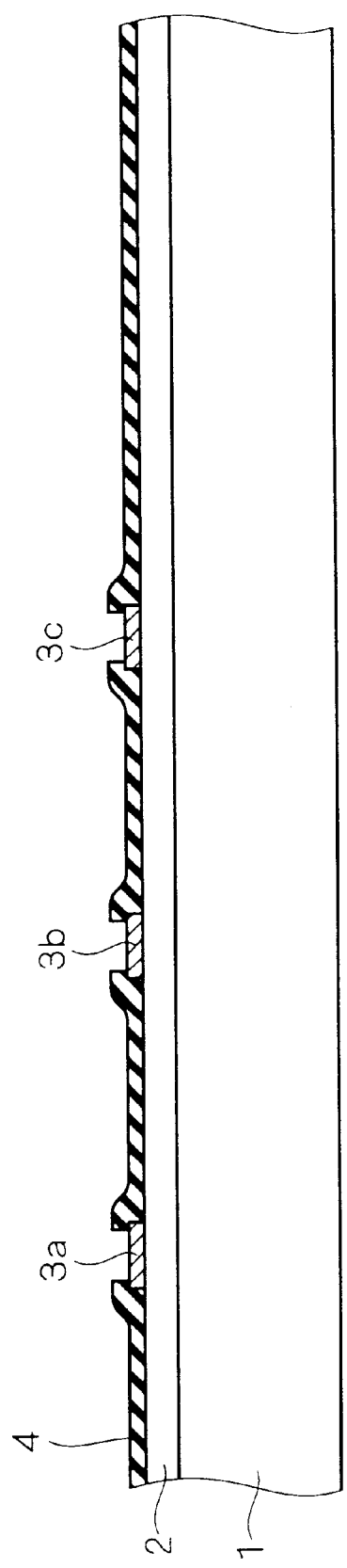
FIGS. 14 through 16 are sectional views showing steps in sequential order starting at formation of the silicon nitride film until the bumps are formed.
Figure 15:
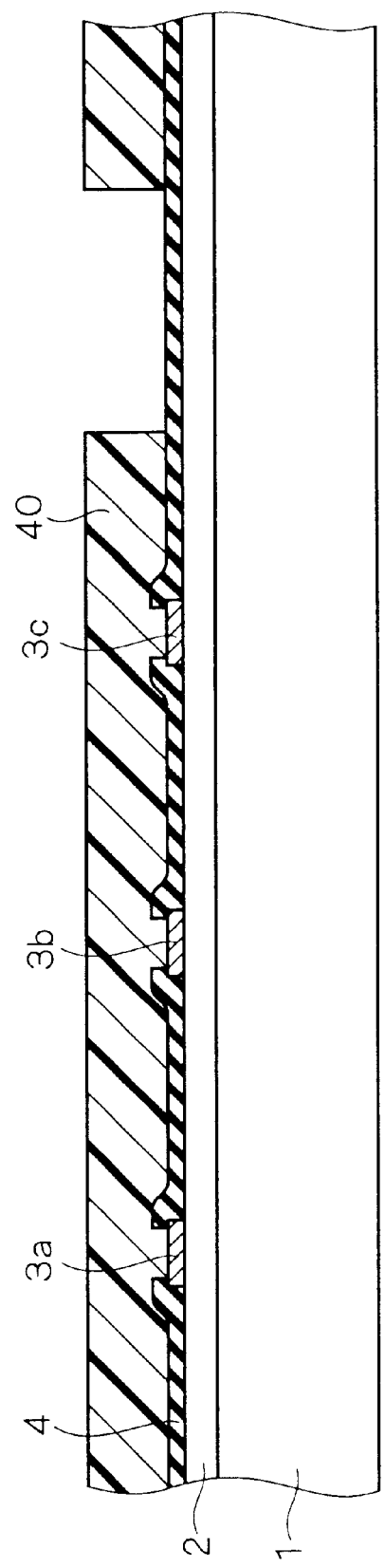
Figure 16:
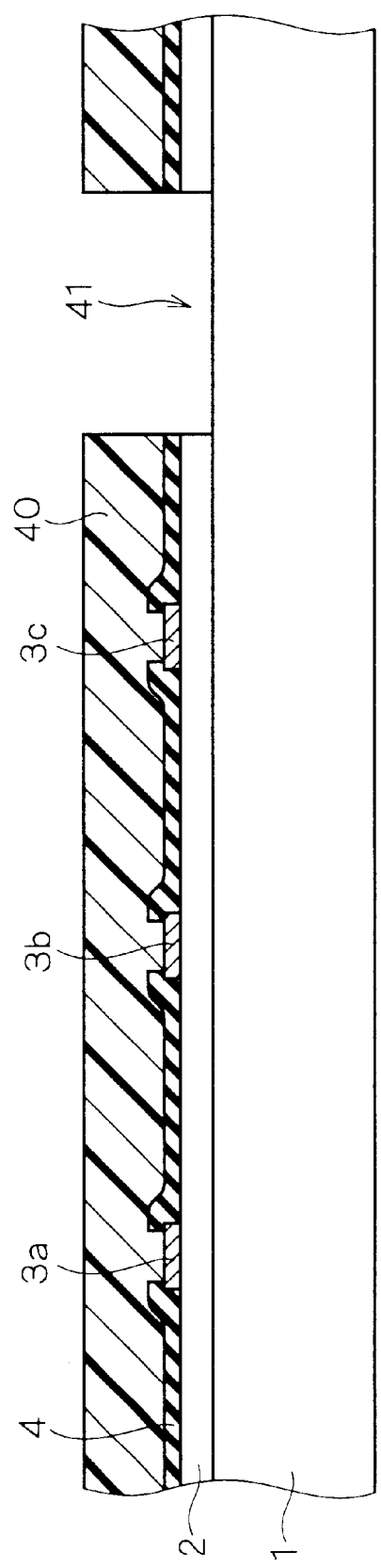

FIGS. 14 through 16 are sectional views showing steps in sequential order starting at formation of the silicon nitride film 4 until the bumps 5a to 5d are formed. First, the structure shown in FIG. 14 is obtained through the manufacturing steps shown in FIGS. 2 to 13. Next, referring to FIG. 15, a photoresist 40 having a predetermined opening pattern is formed on the silicon nitride film 4 and the electrode pads 3a to 3c by photolithography. Then, referring to FIG. 16, using the photoresist 40 as an etching mask, the silicon nitride film 4 and the layer 2 are etched in this order by anisotropic dry etching having a high etching rate in the direction of depth of the silicon substrate 1 until the upper surface of the silicon substrate 1 is exposed. Thereby formed is the hollow 41 having its side surface defined by the silicon nitride film 4 and the layer 2 and its bottom surface defined by the upper surface of the silicon substrate 1.

Next, after removing the photoresist 40, the SOI wafer is subjected to dicing. At last, the bumps 5a to 5c are formed on the electrode pads 3a to 3c, respectively, while the bump 5d is formed on the part of the upper surface of the silicon substrate 1 defining the bottom surface of the hollow 41, thereby obtaining the structure shown in FIG. 1. The bumps 5a to 5d may be formed before the step of dicing the SOI wafer. This applies to second and third preferred embodiments to be described later.

Figure 31:
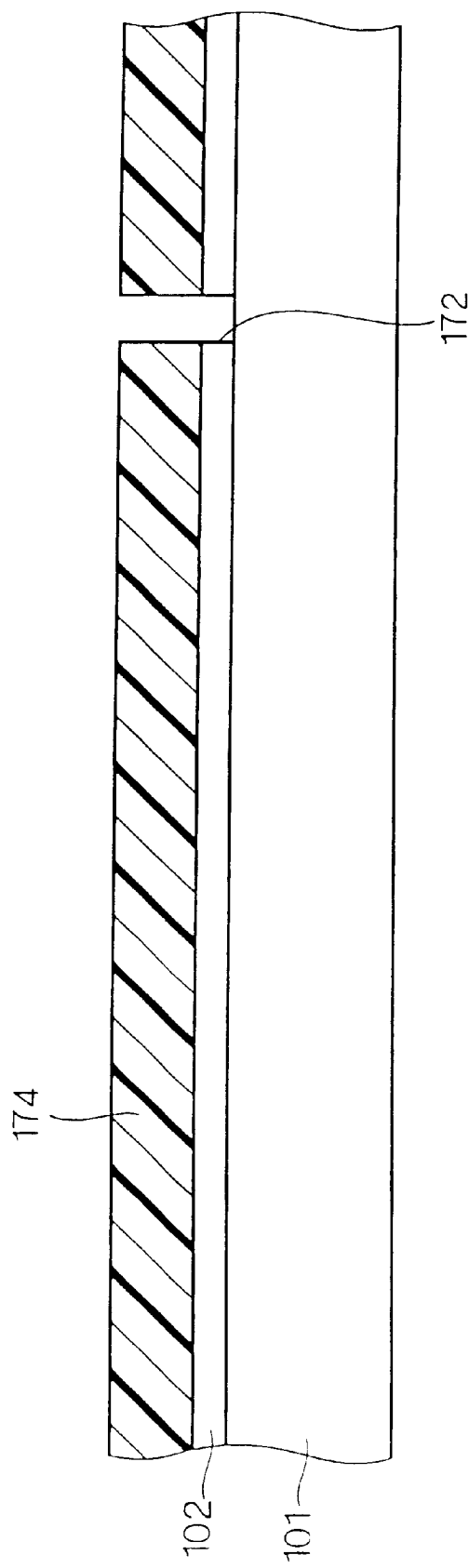
Figure 32:
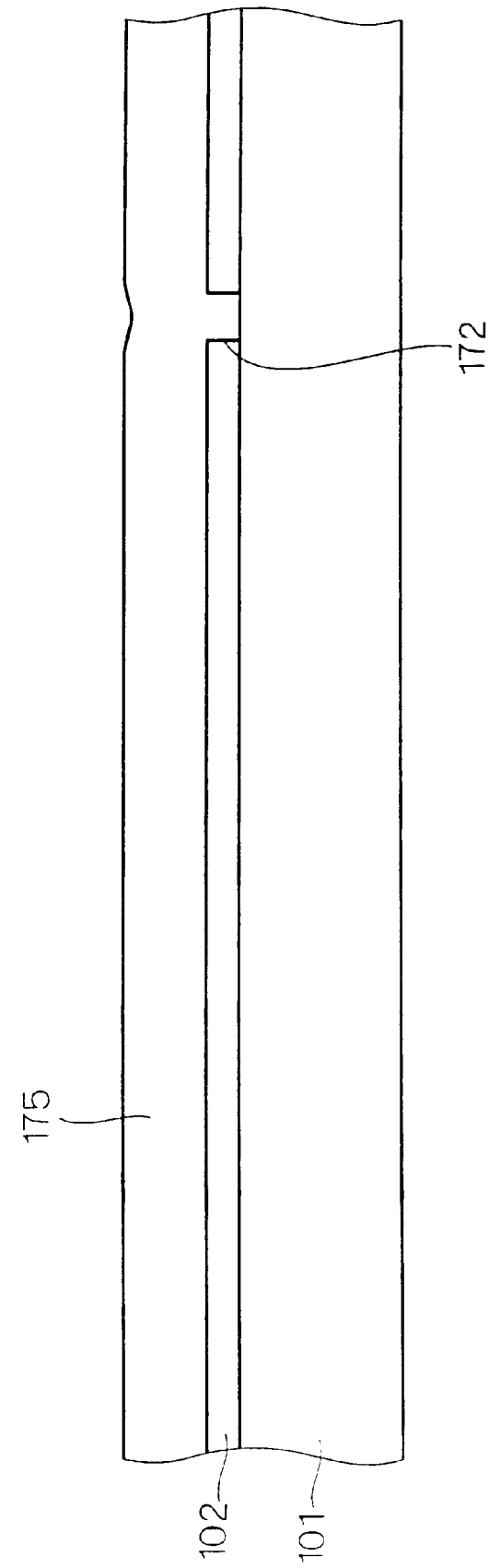
Figure 33:
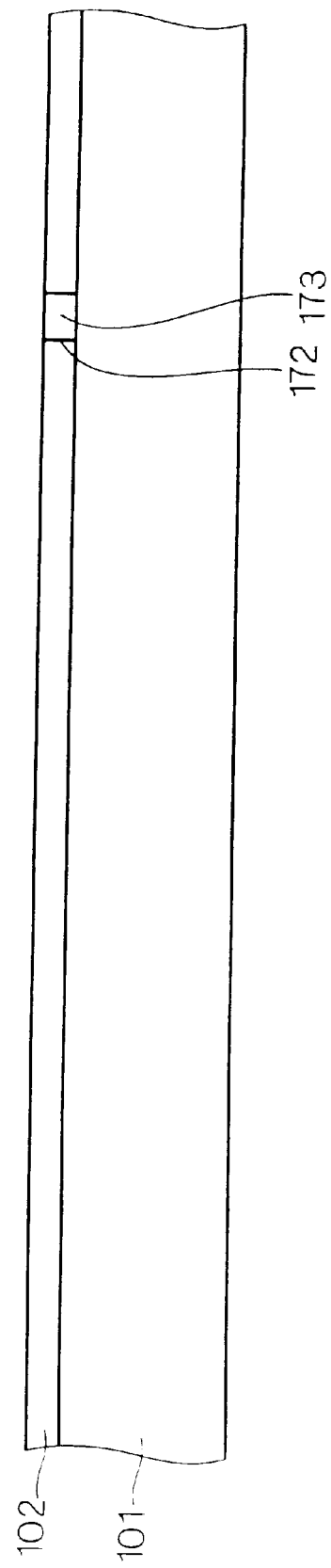
Figure 34:
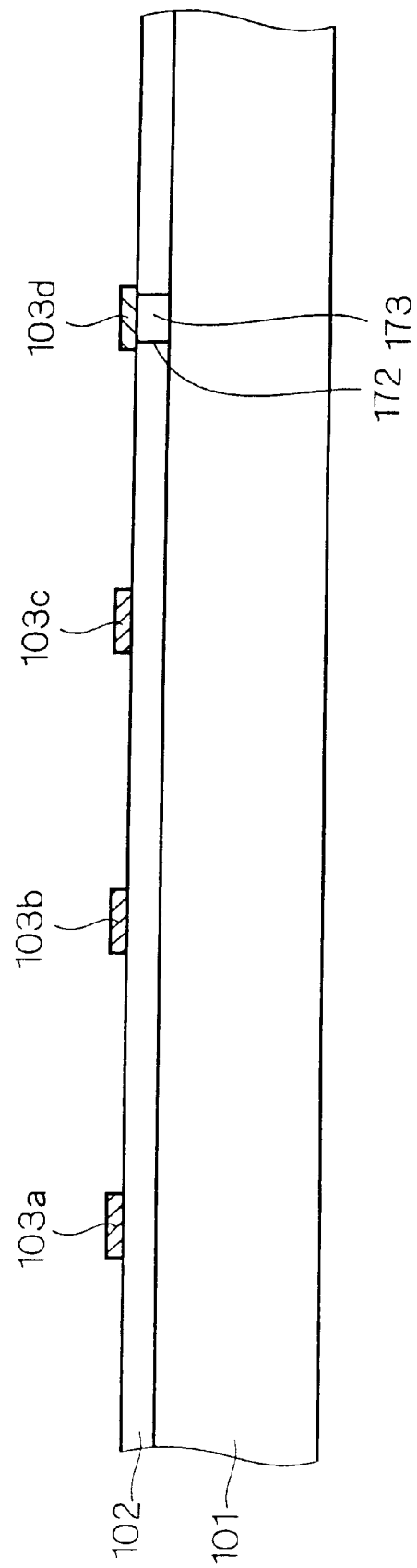

As has been described, in the flip chip and the manufacturing method thereof according to the first embodiment, the bump 5d for fixing a potential of the silicon substrate 1 is formed directly on a part of the upper surface of the silicon substrate 1 exposed by formation of the hollow 41. Therefore, the steps of forming the contact hole 172 (FIG. 31), forming the polysilicon film 175 (FIG. 32) and etching back the polysilicon film 175 (FIG. 33) become unnecessary as in the manufacturing method of the conventional flip chip. This allows simplification of manufacturing.

Second Preferred Embodiment

Figure 17:
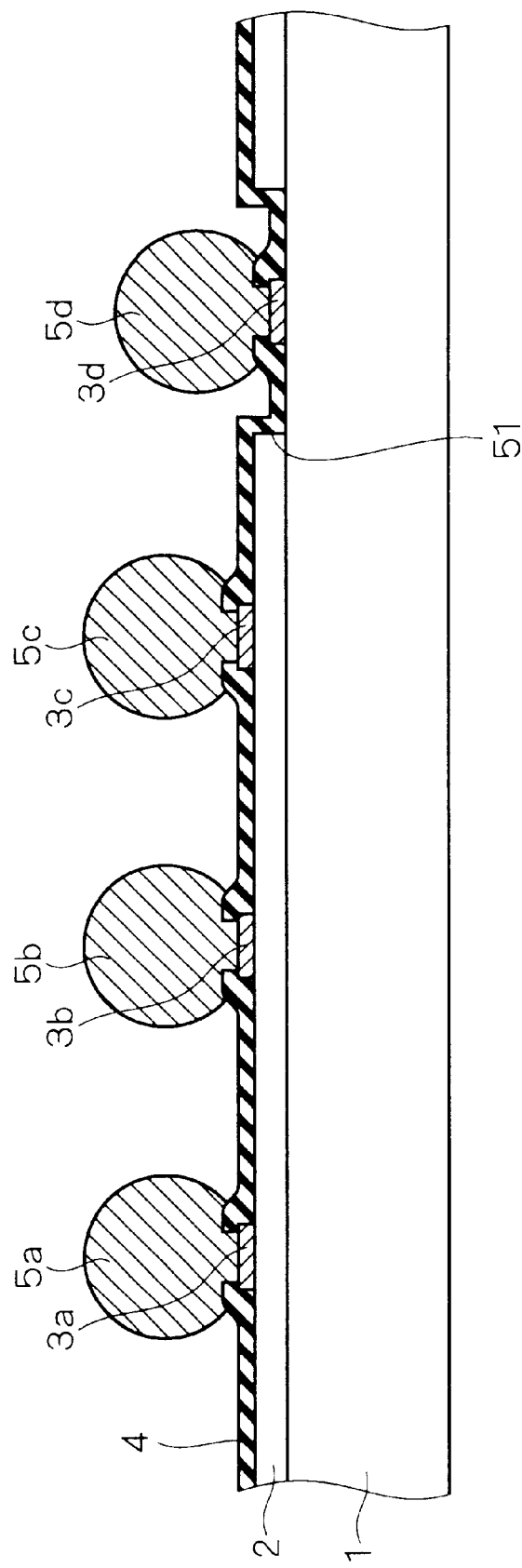
FIG. 17 is a sectional view showing a structure of a flip chip according to a second preferred embodiment of the present invention.

FIG. 17 is a sectional view showing a structure of a flip chip according to a second embodiment. The layer 2 is formed on the upper surface of the silicon substrate 1. Selectively formed in the layer 2 is a hollow 51 extending from the upper surface of the layer 2 to reach the upper surface of the silicon substrate 1. The hollow 51 has its side surface defined by the layer 2 and its bottom surface defined by the upper surface of the silicon substrate 1. The electrode pad 3d made of aluminum is formed on a part of the upper surface of the silicon substrate 1 defining the bottom surface of the hollow 51. Formed on the upper surface of the layer 2 is the silicon nitride film 4, which is also formed on the side surface and the bottom surface of the hollow 51. Further, the silicon nitride film 4 is patterned so as to expose the electrode pads 3a to 3d. The bumps 5a to 5d are formed on the electrode pads 3a to 3d, respectively. The bump 5d is electrically connected to the silicon substrate 1 through the electrode pad 3d.

FIGS. 18 through 22 are sectional views showing manufacturing steps of the flip chip of the second embodiment in sequential order. First, referring to FIG. 18, the structure in which the layer 2 is formed on the silicon substrate 1 is obtained by the same method as in the first embodiment. Next, a photoresist 50 having a predetermined opening pattern is formed on the upper surface of the layer 2 by photolithography. Next, using the photoresist 50 as an etching mask, the layer 2 is etched by anisotropic dry etching having a high etching rate in the direction of depth of the silicon substrate 1 until the upper surface of the silicon substrate 1 is exposed. Formed thereby is the hollow 51 having its side surface defined by the layer 2 and its bottom surface defined by the upper surface of the silicon substrate 1.

Figure 19:
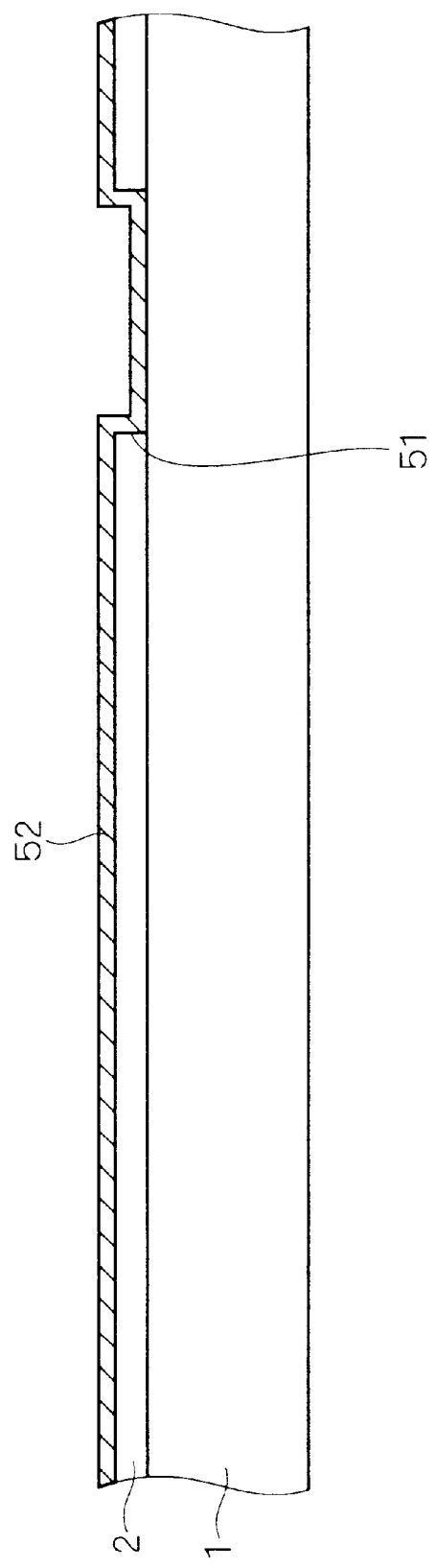

Next, referring to FIG. 19, after removing the photoresist 50, an aluminum film 52 having a thickness approximately raging from 500 nm to 1 μm is formed on the entire surface by spattering method. The aluminum film 52 is also formed on the side surface and the bottom surface of the hollow 51.

Figure 20:
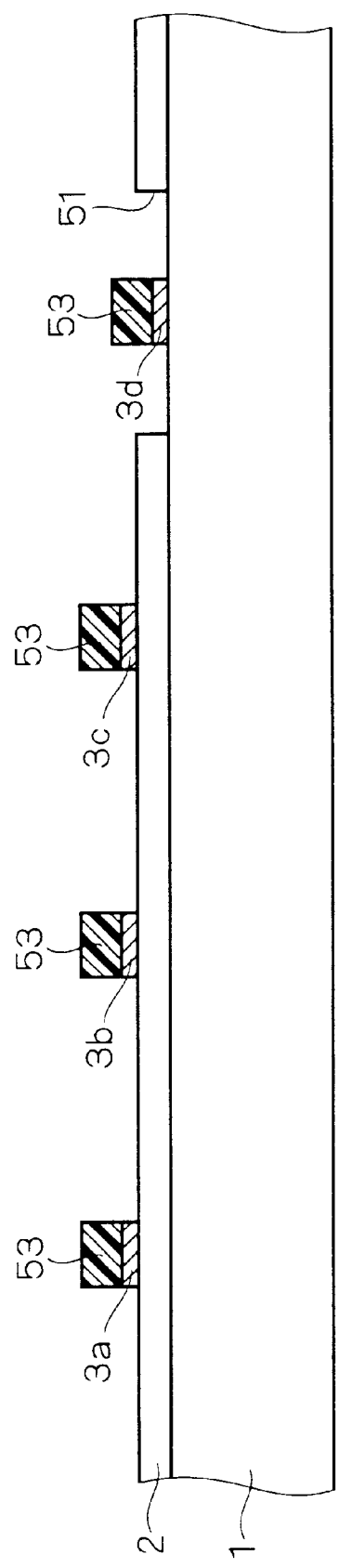

Next, referring to FIG. 20, a photoresist 53 having a predetermined opening pattern is formed on the aluminum film 52 by photolithography. Next, using the photoresist 53 as an etching mask, the aluminum film 52 is subjected to anisotropic dry etching, thereby forming the electrode pads 3a to 3d.

Figure 21:
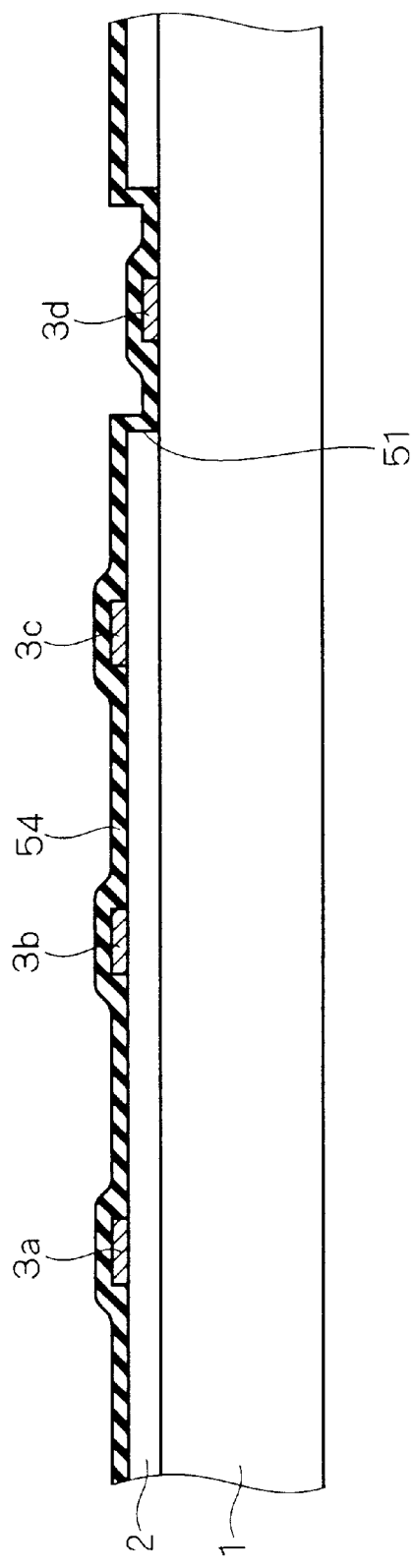
Figure 22:
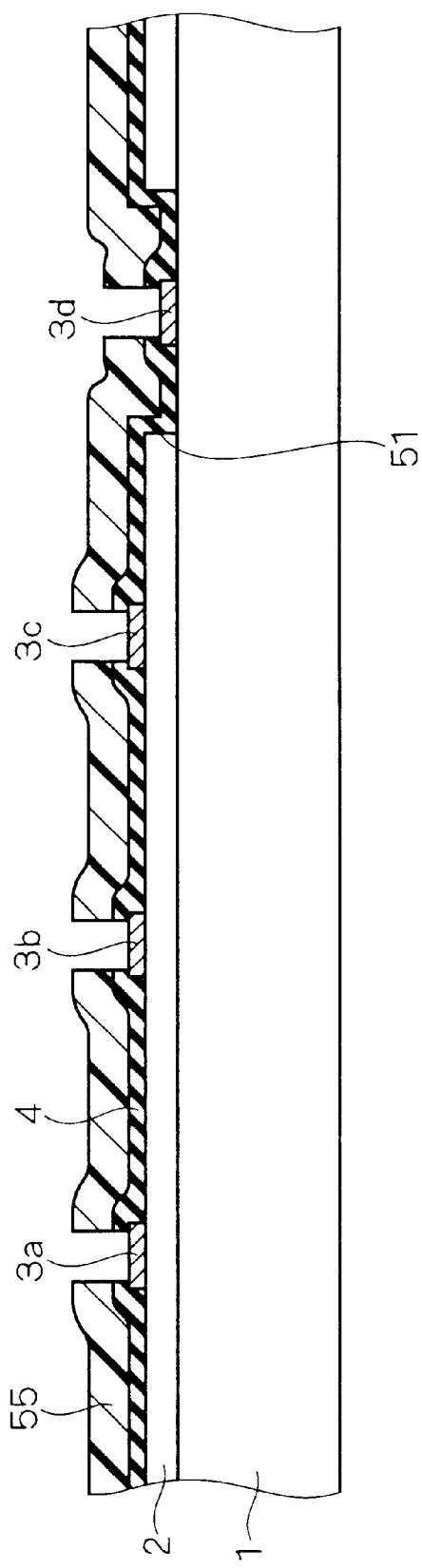

Next, referring to FIG. 21, after removing the photoresist 53, a silicon nitride film 54 of about 500 nm thickness is formed on the entire surface by CVD method. Referring to FIG. 22, a photoresist 55 having a predetermined opening pattern is then formed on the silicon nitride film 54 by photolithography. Next, using the photoresist 55 as an etching mask, the silicon nitride film 54 is subjected to anisotropic dry etching, thereby forming the silicon nitride film 4.

Next, after removing the photoresist 55, the SOI wafer is subjected to dicing. At last, the bumps 5a to 5d are formed on the electrode pads 3a to 3d, respectively, thereby obtaining the structure shown in FIG. 17.

As has been described, in the flip chip and the manufacturing method thereof according to the second embodiment, the electrode pad 3d made of aluminum is formed on the silicon substrate 1 and the bump 5d is formed on the electrode pad 3d. This allows improved adhesion between the bump 5d and the electrode pad 3d compared to the flip chip according to the first embodiment in which the bump 5d is formed directly on the silicon substrate 1.

Further, the electrode pad 3d is formed in the step of forming the electrode pads 3a to 3c. Thus, formation of the electrode pad 3d can be executed without adding a specific step of forming the same.

Third Preferred Embodiment

Figure 23:
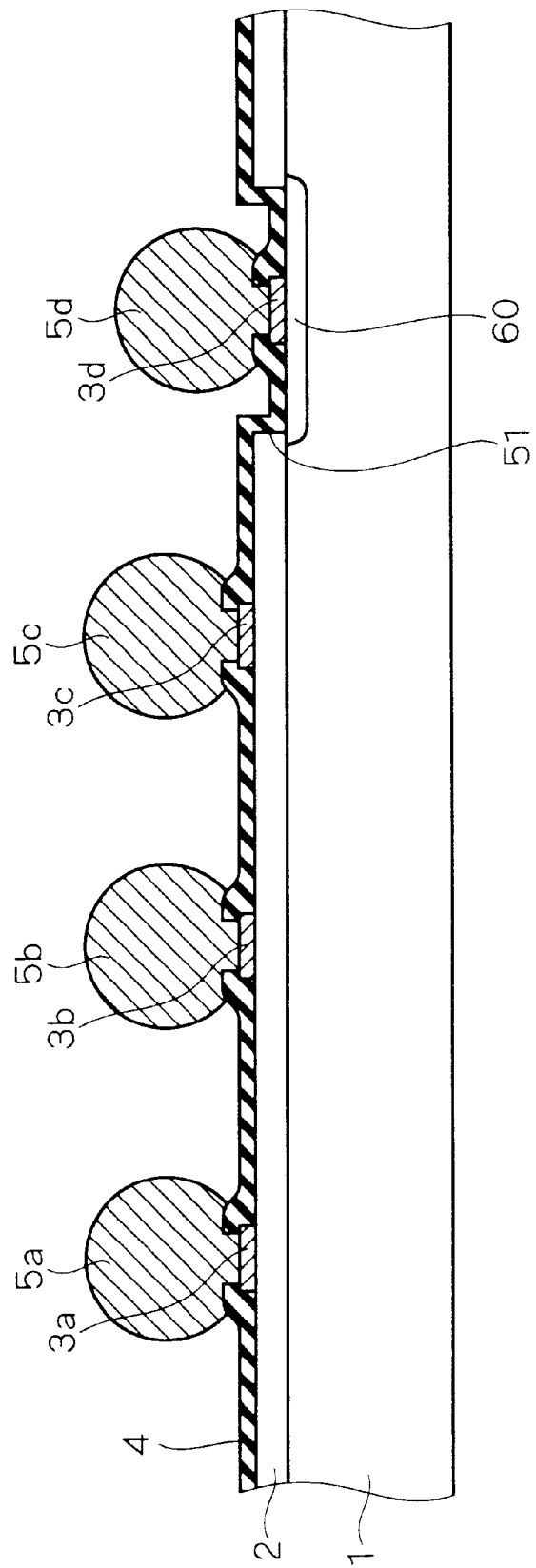
FIG. 23 is a sectional view showing a structure of a flip chip according to a third preferred embodiment of the present invention.

FIG. 23 is a sectional view showing a structure of a flip chip according to a third embodiment. An impurity region 60 of high concentration is formed in the part of the upper surface of the silicon substrate 1 defining the bottom surface of the hollow 51. When the silicon substrate 1 has a conductivity of p type, the impurity region 60 has a conductivity of p$^+$type. The flip chip according to the present embodiment has the same structure as that of the flip chip of the second embodiment shown in FIG. 17 except for the impurity region 60.

Figure 18:
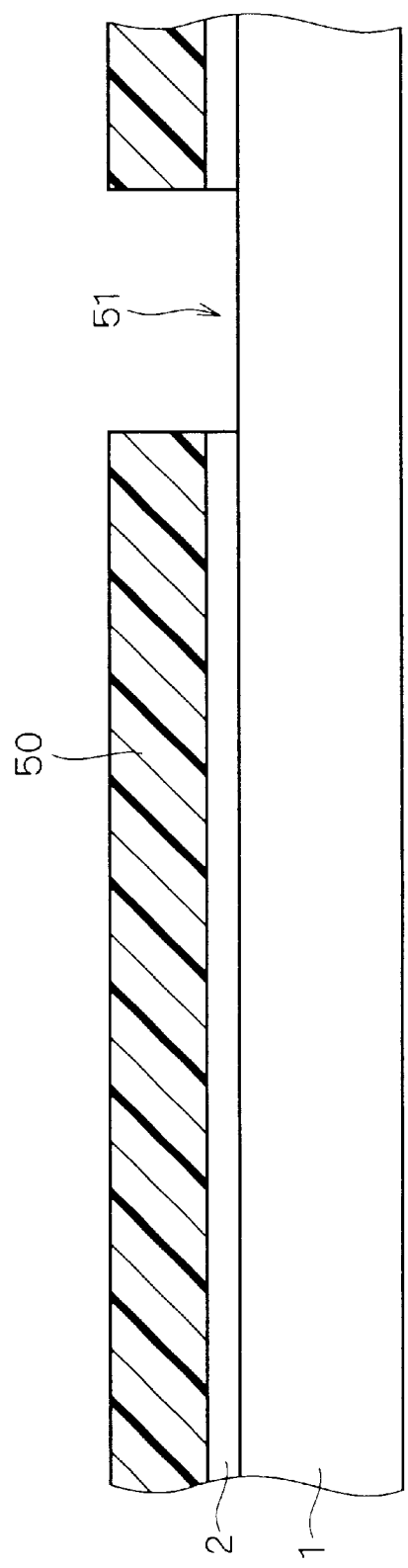
FIGS. 18 through 22 are sectional views showing manufacturing steps of the flip chip of the second embodiment in sequential order.
Figure 24:
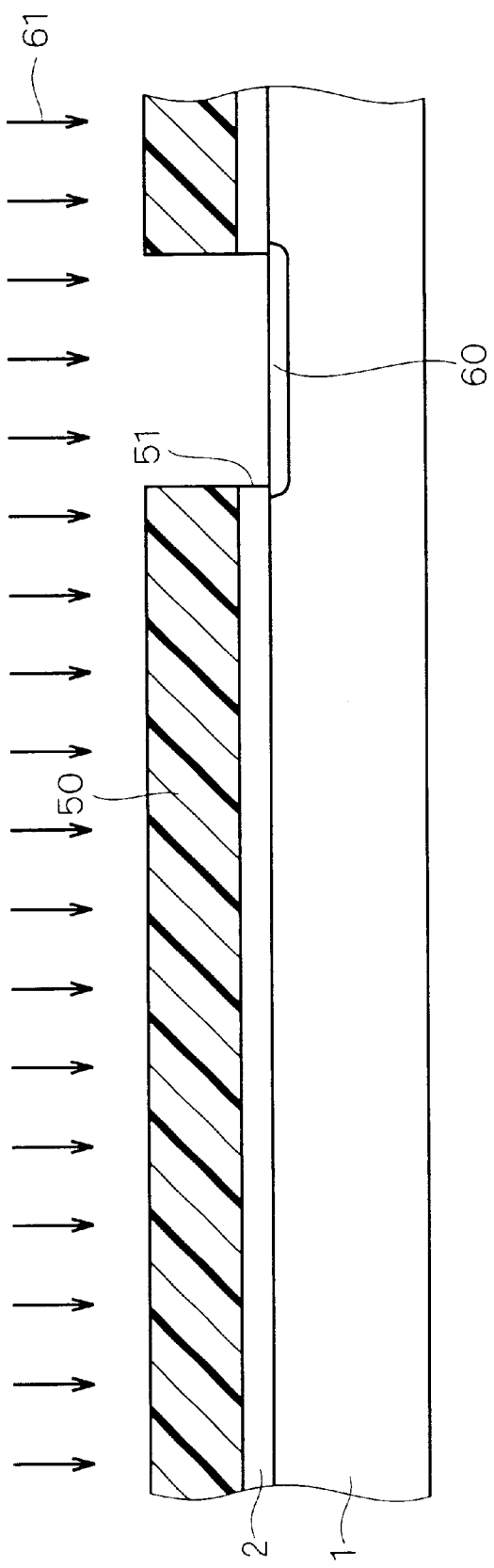
FIG. 24 is a sectional view showing a step of a manufacturing method of the flip chip of the third embodiment.

FIG. 24 is a sectional view showing a step of a manufacturing method of the flip chip according to the present embodiment. First, referring to FIG. 24, the structure shown in FIG. 18 is obtained by the same method as in the second embodiment. Next, using the photoresist 50 as an implantation mask, boron ion 61 is ion implanted into the upper surface of the silicon substrate 1 under the condition of several tens of keV and several e15 cm$^{-2}$. This allows to form the impurity region 60 of p$^+$type in the part of the upper surface of the silicon substrate 1 defining the bottom surface of the hollow 51. Thereafter, the step shown in FIG. 19 follows.

As has been described, in the flip chip and the manufacturing step thereof according to the present embodiment, the impurity region 60 of high concentration is formed in the part of the upper surface of the silicon substrate 1 defining the bottom surface of the hollow 51. This allows reduction of a resistance value of the silicon substrate 1 at a position being in contact with the electrode pad 3d compared to the flip chip according to the second embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an SOI substrate including a semiconductor substrate, an insulation layer formed on a main surface of said semiconductor substrate and a semiconductor layer formed on said insulation layer;
   a semiconductor element selectively formed on said semiconductor layer;
   an interlayer insulation film formed on said semiconductor element and said semiconductor layer;
   a first electrode pad formed on a main surface of said interlayer insulation film, being electrically connected to said semiconductor element;
   a first bump formed on said first electrode pad;
   a hollow selectively formed extending from said main surface of said interlayer insulation film to reach said main surface of said semiconductor substrate; and
   a second bump formed on said semiconductor substrate which defines a bottom surface of said hollow.

2. The semiconductor device according to claim 1, wherein
   said second bump is formed directly on said main surface of said semiconductor substrate.

3. The semiconductor device according to claim 1 further comprising:
   a second electrode pad formed on said main surface of said semiconductor substrate which defines said bottom surface of said hollow, wherein
   said second bump is formed on said second electrode pad.

4. The semiconductor device according to claim 3, wherein
   said second electrode pad is made of aluminum.

5. The semiconductor device according to claim 3 further comprising
   an impurity region formed in said main surface of said semiconductor substrate which defines said bottom surface of said hollow.

6. The semiconductor device according to claim 5, wherein
   said impurity region has an impurity concentration higher than that of said semiconductor substrate.

* * * * *